US011145543B2

(12) United States Patent
Clevenger et al.

(10) Patent No.: US 11,145,543 B2
(45) Date of Patent: Oct. 12, 2021

(54) SEMICONDUCTOR VIA STRUCTURE WITH LOWER ELECTRICAL RESISTANCE

(71) Applicant: International Business Machines Corporation, Armonk, NY (US)

(72) Inventors: Lawrence A. Clevenger, Saratoga Springs, NY (US); Baozhen Li, South Burlington, VT (US); Kirk D. Peterson, Jericho, VT (US); Terry A. Spooner, Mechanicville, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/541,448

(22) Filed: Aug. 15, 2019

(65) Prior Publication Data
US 2019/0371663 A1 Dec. 5, 2019

Related U.S. Application Data

(60) Continuation of application No. 15/800,438, filed on Nov. 1, 2017, now Pat. No. 10,460,990, which is a
(Continued)

(51) Int. Cl.
*H01L 21/768* (2006.01)
*H01L 23/522* (2006.01)
*H01L 23/532* (2006.01)

(52) U.S. Cl.
CPC .. *H01L 21/76877* (2013.01); *H01L 21/76831* (2013.01); *H01L 21/76843* (2013.01); *H01L 21/76844* (2013.01); *H01L 21/76847* (2013.01); *H01L 23/5226* (2013.01); *H01L 23/53238* (2013.01); *H01L 23/53209* (2013.01); *H01L 23/53223* (2013.01)

(58) Field of Classification Search
None
See application file for complete search history.

(56) References Cited

U.S. PATENT DOCUMENTS 5,933,753 A 8/1999 Simon et al.
6,265,779 B1 7/2001 Grill et al.
(Continued)

OTHER PUBLICATIONS

Clevenger, et al.; "Semiconductor Via Structure With Lower Electrical Resistance"; U.S. Appl. No. 14/945,640, filed Nov. 19, 2015.
(Continued)

*Primary Examiner* — Nicholas J Tobergte
*Assistant Examiner* — Kien C Ly
(74) *Attorney, Agent, or Firm* — Cantor Colburn LLP; L. Jeffrey Kelly

(57) ABSTRACT

A semiconductor device and method of making the same, wherein in accordance with an embodiment of the present invention, the device includes a first conductive line including a first conductive material, and a second conductive line including a second conductive material. A via connects the first conductive line to the second conductive line, wherein the via includes conductive via material, wherein the via material top surface is coated with a liner material, wherein the via is a bottomless via.

9 Claims, 2 Drawing Sheets

Related U.S. Application Data division of application No. 14/945,640, filed on Nov. 19, 2015, now Pat. No. 9,837,309.

(56) References Cited

U.S. PATENT DOCUMENTS

| | | | |
|---|---|---|---|
| 6,414,395 B1 | 7/2002 | Ookuma et al. | |
| 6,436,814 B1 | 8/2002 | Horak et al. | |
| 6,531,407 B1* | 3/2003 | Huang | H01L 21/76832 |
| | | | 438/758 |
| 6,731,007 B1 | 5/2004 | Saito et al. | |
| 6,806,579 B2 | 10/2004 | Cowley et al. | |
| 6,958,540 B2 | 10/2005 | Gambino et al. | |
| 7,327,033 B2 | 2/2008 | Edelstein et al. | |
| 7,585,758 B2 | 9/2009 | Luce et al. | |
| 7,671,470 B2 | 3/2010 | Yango et al. | |
| 7,776,737 B2 | 8/2010 | Bonilla et al. | |
| 8,164,190 B2 | 4/2012 | Filippi et al. | |
| 8,349,723 B2 | 1/2013 | Filippi et al. | |
| 8,624,395 B2 | 1/2014 | Hsu et al. | |
| 8,664,766 B2 | 3/2014 | Yang et al. | |
| 9,224,640 B2 | 12/2015 | Burke et al. | |
| 9,312,203 B2 | 4/2016 | Li et al. | |
| 9,391,019 B2 | 7/2016 | Kobrinsky et al. | |
| 9,941,206 B2 | 4/2018 | Kang | |
| 10,032,712 B2 | 7/2018 | Chen et al. | |
| 2003/0203624 A1* | 10/2003 | Sameshima | C09K 13/06 |
| | | | 438/687 |
| 2004/0262764 A1 | 12/2004 | Gambino et al. | |
| 2006/0024953 A1 | 2/2006 | Papa Rao et al. | |
| 2006/0033215 A1 | 2/2006 | Blanchet et al. | |
| 2007/0284736 A1 | 12/2007 | Yang et al. | |
| 2009/0032951 A1 | 2/2009 | Andry et al. | |
| 2012/0080771 A1 | 4/2012 | Yang et al. | |
| 2014/0035109 A1 | 2/2014 | Volant et al. | |
| 2014/0042627 A1* | 2/2014 | Edelstein | H01L 23/5226 |
| | | | 257/758 |
| 2014/0061917 A1 | 3/2014 | Kim et al. | |
| 2014/0175655 A1* | 6/2014 | Chen | H01L 23/481 |
| | | | 257/762 |
| 2014/0264873 A1 | 9/2014 | Ting et al. | |
| 2015/0249036 A1 | 9/2015 | Cai et al. | |
| 2016/0056071 A1 | 2/2016 | Draeger et al. | |

OTHER PUBLICATIONS

Clevenger, et al.; "Semiconductor Via Structure With Lower Electrical Resistance"; U.S. Appl. No. 15/800,438, filed Nov. 1, 2017.
List of IBM Patents or Patent Applications Treated as Related; Date Filed: Aug. 16, 2019, 2 pages.

* cited by examiner

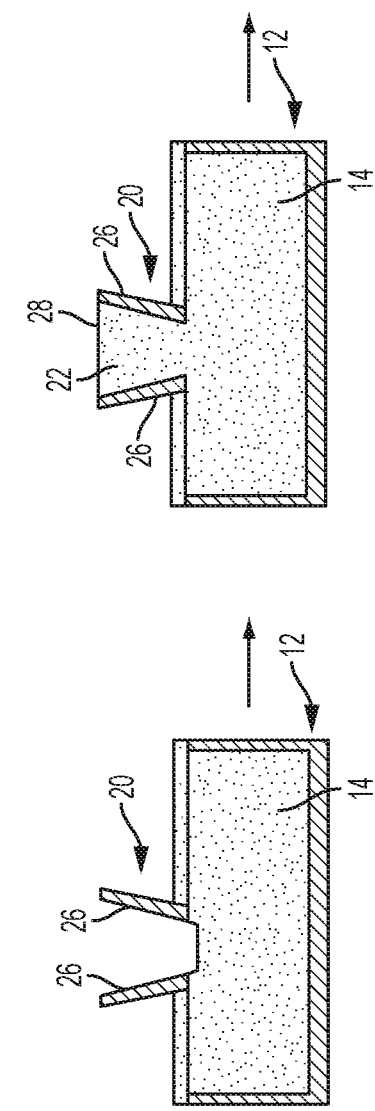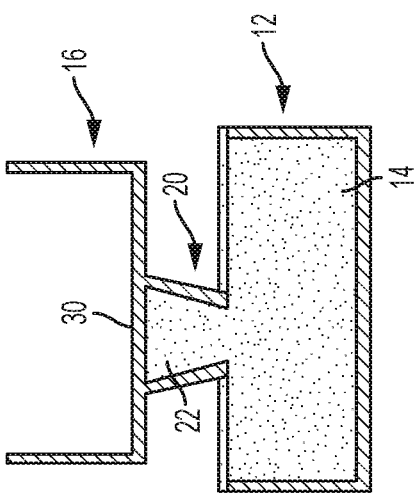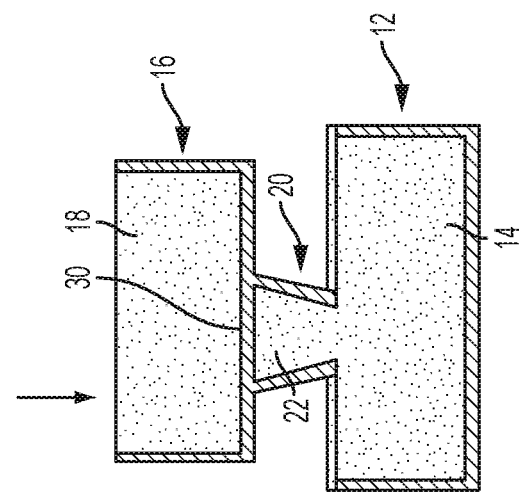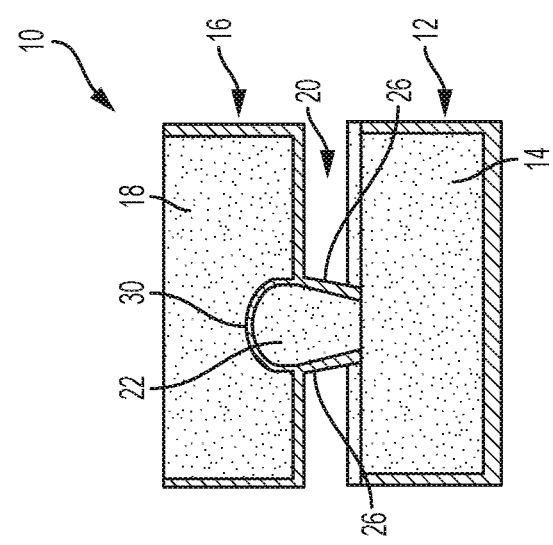

SEMICONDUCTOR VIA STRUCTURE WITH LOWER ELECTRICAL RESISTANCE

DOMESTIC PRIORITY

This application is a continuation of U.S. application Ser. No. 15/800,438 filed Nov. 1, 2017, which is a divisional of U.S. application Ser. No. 14/945,640, filed Nov. 19, 2015, now issued as U.S. Pat. No. 9,837,309 the contents of which are hereby incorporated by reference in its entirety.

BACKGROUND

The present invention relates to structures, and more specifically, to via structures preventing the creation of void fails.

A semiconductor device contains an array of contacts interconnected by patterns of conductive wires. Due to the level of integration of devices and circuits on a semiconductor chip, interconnections can generally no longer be made by means of single level network on conductive lines and it is necessary to form two or more levels of conductive lines that are vertically spaced and separated by an intermediate insulator layer or dielectric layer.

Connections between the different levels of conductive lines can be made by means of vias which are etched through the insulator layers separating the levels. The vias are filled with metal to form via studs. The multiple levels of conductor wiring interconnection patterns operate to distribute signals among the circuits on the semiconductor chip.

In conventional semiconductor structures, via structures suffer from electromigration-induced voiding in damascene and dual-damascene wiring. To prevent electromigration of the via material, the via may be lined with a liner material, however, the addition of liner material increases the resistivity of the via, and thereby the semiconductor.

SUMMARY

According to one embodiment, a method of forming a device is provided. The method includes providing a first conductive line including a first conductive material and a second conductive line, wherein the first conductive line and second conductive line are connected by a via, wherein the via includes two via side walls and a via bottom surface; depositing a first liner material along inner surfaces of the via side walls and the via bottom surface; removing the liner material from the via bottom surface; depositing a via material into the via forming a via material top surface; and depositing a second liner material on the via material top surface.

According to one embodiment, a semiconductive device is provided. The device includes a first conductive line including a first conductive material; a second conductive line including a second conductive material; a via connecting the first conductive line and the second conductive line, wherein the via includes a via material, wherein the via material includes a via material top surface, wherein the via material is in direct physical contact with the first conductive line, wherein the via material top surface is convex; a first liner material coating inner surfaces of the via side walls; and a second liner material coating the via material top surface.

According to one embodiment, a semiconductor device is provided. The device includes a first conductive line including a first conductive material; a second conductive line including a second conductive material; a via connecting the first conductive line and the second conductive line, wherein the via includes a via material, wherein the via material includes a via material top surface; a first liner material coating inner surfaces of the via side walls; and a second liner material coating the via material top surface.

BRIEF DESCRIPTION OF THE DRAWINGS

FIGS. 2A through 2C illustrate an exemplary fabrication process of forming a semiconductor device according to an embodiment, in which:

FIG. 2A is a cross-sectional view illustrating deposition of a first liner material along the surfaces of the via according to an embodiment;

FIG. 2B is a cross-sectional view of the semiconductor device illustrating the via filled with a via material after the first liner material has been removed from the bottom surface of the via according to an embodiment; and FIG. 2C is a cross-sectional view of the semiconductor device illustrating deposition of a second liner material on the via material top surface according to an embodiment.

FIGS. 3A through 3D illustrate an exemplary fabrication process of forming a semiconductor device according to an embodiment, in which:

FIG. 3A is a cross-sectional view illustrating deposition of a first liner material along the surfaces of the via and removal of the first liner material from the via bottom surface according to an embodiment;

FIG. 3B is a cross-sectional view of the semiconductor device illustrating the via filled with a via material according to an embodiment;

FIG. 3C is a cross-sectional view of the semiconductor device illustrating the incorporation of a second conductive line lined with a second liner material according to an embodiment; and FIG. 3D is a cross-sectional view of the semiconductor device illustrating deposition of a second conductive material in the second conductive line according to an embodiment.

FIG. 4 is a cross-sectional view of the semiconductor device wherein the via material top surface is convex according to an embodiment.

DETAILED DESCRIPTION

Figure 1:
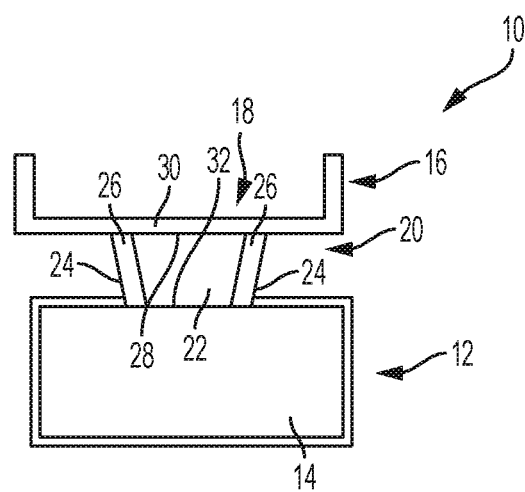
FIG. 1 is a cross-sectional view of the semiconductor device according to an embodiment.

The semiconductive device includes a via connecting the first conductive line to a second conductive line. The via may be formed by any conventional means. For example, the via may be formed by first masking an insulating layer or dielectric layer containing the first and second conductive lines with photoresist and then selectively etching a portion of the insulating or dielectric layer. The via may be etched through an opening formed in the photoresist using well known photolithographic techniques to form an opening to the underlying conductive layer. After the via etch, and photoresist removal, a liner material may be deposited along the via inner surfaces to separate the insulator or dielectric material and the conductive via material. The via material may be deposited in the lined via, wherein the via material is a conductive material to form the electrical connection between the first and second conductive lines. In an example, a first conductive line is formed, followed by formation of the via, then the second conductive line is formed, wherein the via connects the first conductive line to the second conductive line.

In addition to adding structural integrity to the device, the presence of a liner material on the sidewalls of the via is desirable because structural delamination and diffusion of the conductive via material can occur unless there is a layer of protection between the conductive via material and the etched insulating layer. The sidewall liner is also important for copper seeding and plating in the via, as well as reducing electromigration. Electromigration or diffusion of the via material into the insulator or dielectric material containing the conductive lines, and/or between two conductive layers, may be reduced by increasing the thickness of the liner material separating the via material from the insulator or dielectric material. However, increasing the liner thickness results in an increase in via resistance. An increase in resistance is not desirable because it will lead to slower propagation of electrical signals through the device.

In addition to the sidewall liner, vias may include a top via liner and/or bottom via liner of a certain thickness to enable electromigration short length effect. The top and bottom liners prevent copper from diffusing between the two conducting lines, when one or both of the lines fall into the short length range, the electromigration performance will be enhanced. Thinning the via bottom liner can effectively reduce the via resistance, however, a thin bottom liner can have a detrimental effect on electromigration and the formation of voids in the via. In one embodiment of the present invention, the present semiconductor device reduces both electromigration and via electrical resistance by incorporating a liner material on the top surface of the via material, wherein the via does not include a liner material on the bottom of the via. In an example, the via includes via material that may be directly in physical contact with the first interlevel dielectric material. In other words, the via includes conductive material that is in direct contact with the first (bottom) level conductive line material.

Further, the semiconductor device provided results in reduced resistance by employing the liner material on the top surface of the via material, in contrast to when the bottom surface of the via material includes the liner material. In an embodiment, the top surface of the via material is concave providing an increase in surface area to which the liner material is deposited.

FIG. 1 illustrates a cross-section of a semiconductor device 10 in accordance with an embodiment of the present invention. More specifically, in one embodiment, the semiconductor device 10 includes a first conductive line 12 including a first conductive material 14 and a second conductive line 16 including a second conductive material 18. A via 20 connects the first conductive line 12 to the second conductive line 16, wherein the via includes via material 22. As further illustrated in FIG. 1, two via side walls 24 are coated with a first liner material 26 and a via material top surface 28 is coated with a second liner material 30, wherein the first liner material 26 and the second liner material 30 may be the same or different. The first liner material 26, via material 22, and second liner material 30 may independently be deposited by supporting, Rf sputtering, CVD, electroless deposition, electrodeposition, or combinations thereof.

The semiconductor device 10 may have a bottomless via wherein no portion of a liner material is directly beneath the via. A liner material may be deposed on the two side walls 24 and a via bottom surface 32 but the liner material on the via bottom surface, between the two via side walls may be eliminated by any conventional removal technique. For example, the liner material deposited on the via bottom surface may be removed by depositing a liner dep process whose thickness decreases with increasing aspect ratio, followed by an argon sputter step. Alternatively, or in addition to, the liner material coating the via bottom surface 32 may be removed with a separate masking and etching step.

Figures 2A, 2B:
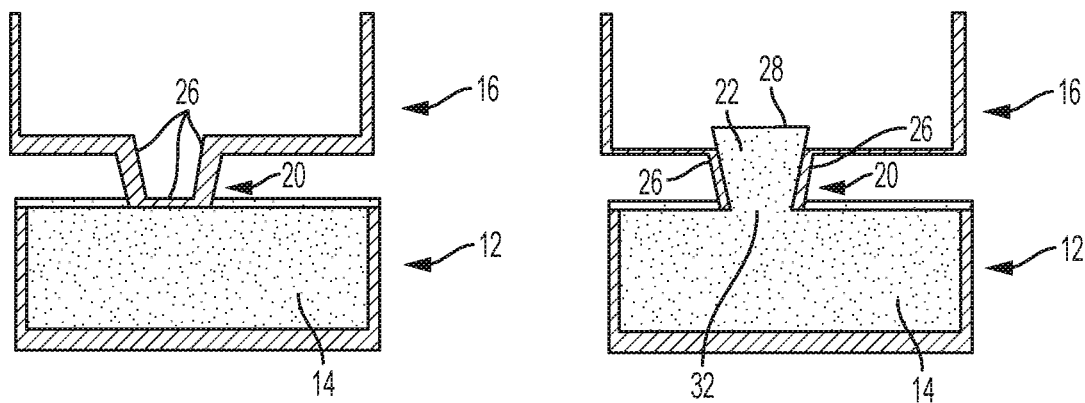
Figure 2C:
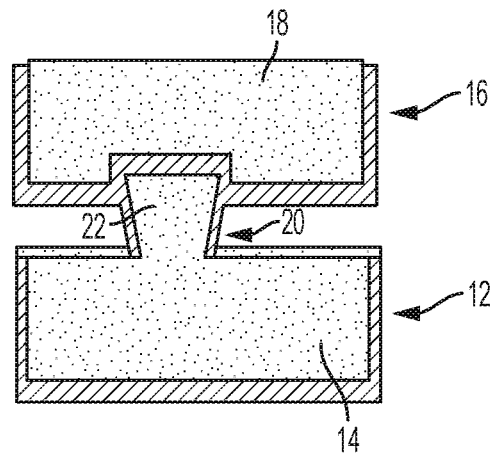

FIGS. 2A-2C illustrate an embodiment of a fabrication process for forming the semiconductor device 10 using a dual damascene method. For example, as shown in FIG. 2A, a first liner material 26 is formed on the two via side walls 24 and the via bottom surface 32. The first liner material 26 can be formed by physical vapor deposition (PVD) or chemical vapor deposition (CVD). The first liner material 26 on the via bottom surface 32 may be etched back without removing the first liner material 26 from the two via side walls 24.

As shown in FIG. 2B, the via material is deposited into the via by any suitable technique. In an example, the via material is electrodeposited wherein first a seed layer is deposited using PVD and second the via material is electroplated. The via material top surface 28 may be planarized using CMP such that the via material top surface 28 is level with a bottom surface of the second conductive line 16. Alternatively, the via material top surface 28 may extend above a bottom surface of the second conductive line 16. In an example, as shown in FIG. 4, the via material top surface 28 is curved, e.g., convex, further increasing the surface area of the via material top surface 28. In an example, a deposition of a seed layer of the via material prior to the electroplating of the via material creates an environment that is more conducive to electroplating. The seed layer facilitates the formation of a single crystalline via material structure at the interface between the via and the first interlevel dielectric material because the seed layer is structurally similar to the electroplated via material.

The via material 22 can be any suitable conductive material, such as, a metallic material or alloy. For example, the via material 22 may include copper, aluminum, cobalt, or combinations thereof.

As illustrated in FIG. 2C, the method may include depositing a second liner material 30 on the via material top surface 28 and filling the second interlayer dielectric channel 16 with a second conductive material 18.

The first liner material 26 and the second liner material 30 may be the same or different. The liner material (i.e., the first liner material 26 and the second liner material 30) may generally have a higher resistance than the conductive via material 22. The liner material is generally selected to simultaneously minimize contact resistance, provide adequate adhesion to the via surface, and provide a good diffusion barrier.

The first liner material 26 and the second liner material 30 can independently include any other damascene liner material as known in the art. In an example, the first liner material 26 and the second liner material 30 can independently include titanium, titanium nitride, tungsten, titanium tungsten, tungsten nitride, tantalum, TaN, TaN/Ta, Ta/TaN, Ta/TaN/Ta, or combinations thereof. The first liner material 26 and the second liner material 30 can be the same or different. In an example, the second liner material 30 includes a highly conductive metal, for example, cobalt, nickel, or ruthenium.

In an embodiment illustrated in FIGS. 3A-3D, the semiconductor structure can be formed using a series of single damascene fabrication steps. For example, as illustrated in FIG. 3A a first conductive line 12 including a first conductive material 14 is provided, wherein the first conductive line 12 is connected to a via 20. The method includes depositing a first liner material 26 to the inner surfaces of the via side walls 24 and the via bottom surface, followed by etching back the first liner material 26 from the via bottom surface without removing the first liner material 26 from the via side walls 24.

FIG. 3B illustrates depositing the via material 22 into the via 20. The via material may be deposited by electroplating followed by CMP. FIG. 3C illustrates forming the second conductive line 16 and depositing a second liner material 30 along the via material top surface 28. The second liner material 30 may be deposited along at least a portion of the inner bottom surface of the second conductive line 16. As shown in FIG. 3D, the second conductive line 16 may be deposited with the second conductive material 18.

The disclosed semiconductor device 10 reduces the resistance by increasing the contact area between the via material 22 and the second conductive material 18. The via material 22 may be deposited in a manner wherein the via material top surface 28 forms a meniscus, further increasing the surface area of the via material top surface 28. In other words, the via material top surface 28 may be curved, e.g., convex.

In an example, a via may have the dimensions of a bottom size of 18 nm by 18 nm, via side walls of 38 nm tall, a 45° chamfering with a one non-SAV direction and 87° chamfering on the SAV (self-aligned via) direction. The via side walls include a 3.5 nm thick liner material of Ta/TaN. In the example, it is assumed the copper resistivity is 60 $\Omega \cdot nm$ at 25° C. and the Ta/TaN liner material has a resistivity of 1000 $\Omega \cdot nm$. As a comparative example, in the traditional via configuration with the liner material at the via bottom surface having a thickness of 4.5 nm, the electrical resistance of the via is approximately 43$\Omega$. For a semiconductor according to the present invention, wherein only the via top surface is coated with the liner material, and the via top surface is planar, the via resistance is approximately 14$\Omega$. For a semiconductor according to the present invention, wherein only the via top surface is coated with the liner material, and the via top surface is concave, the via resistance is reduced further to approximately 12$\Omega$.

The configuration of semiconductor device 10 creates electromigration short length effects between the first conductive line and the second conductive line. These short length effects prevent electromigration of the via material into the conductive line. Specifically, the via separates the conductive lines for via material mass flow such that the lengths of the conductive lines are short enough to create short length effects in the conductive lines, thereby preventing electromigration from occurring. In an example, the length of each conductive line is in the range of 5 to 30 micrometers to create the short length effect depending on the width and thickness of the conductive lines.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As stated above, the present invention relates to MOSFETs, and particularly to interconnect technology, which are now described in detail with accompanying figures. It is noted that like reference numerals refer to like elements across different embodiments.

The following definitions and abbreviations are to be used for the interpretation of the claims and the specification. As used herein, the terms "comprises", "comprising", "includes", "including", "has", "having", "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

What is claimed is:

1. A method of forming a device, comprising:
providing a first conductive line including a first conductive material and a second conductive line, wherein the first conductive line and second conductive line are connected by a via, wherein the via includes two via side walls and a via bottom surface;
depositing a first liner material along inner surfaces of the via side walls and the via bottom surface;
removing the first liner material from the via bottom surface;
depositing a via material into the via forming a via material top surface, wherein the via material top surface is curved; and
depositing a second liner material that covers the via material such that the via material top surface of the via material extends above and away from a bottom surface of the second liner material.

2. The method of claim 1, wherein the via material top surface extends above a bottom surface of the second conductive line.

3. The method of claim 1, wherein the first liner material includes a semiconductor material or an insulator material.

4. The method of claim 1, wherein the second liner material includes a semiconductor material or an insulator material.

5. The method of claim 1, wherein the first liner material and the second liner material are the same.

6. The method of claim 1, wherein the first liner material and the second liner material may be independently selected from the group consisting of titanium, titanium nitride, tungsten, titanium tungsten, tungsten nitride, tantalum, TaN, TaN/Ta, Ta/TaN, Ta/TaN/Ta, or combinations thereof.

7. The method of claim 1, wherein the via material includes copper.

8. The method of claim 1, further comprising filling the second conductive line with a second conductive material using a deposition process.

9. The method of claim 8, wherein the first conductive material and the second conductive material are different.

\* \* \* \* \*